United States Patent [19]

Clayton, Jr. et al.

[11] 4,101,837

[45] Jul. 18, 1978

[54] THRESHOLD EXTENSION FM DEMODULATOR APPARATUS FOR WIDE BAND WIDTH FM SIGNALS

[75] Inventors: Lorimer Clayton, Jr., Stone Mountain; Elias J. Livaditis, Tucker, both of Ga.

[73] Assignee: Scientific-Atlanta, Inc., Atlanta, Ga.

[21] Appl. No.: 795,991

[22] Filed: May 11, 1977

[51] Int. Cl.[2] .......................... H04B 1/10; H04N 5/44; H03D 3/00

[52] U.S. Cl. ..................................... 325/347; 325/477; 329/134; 329/136; 329/139; 358/160

[58] Field of Search ............... 325/344, 347, 491, 427, 325/349, 473, 477, 482, 479; 329/134, 136, 139, 170; 358/160

[56] References Cited

U.S. PATENT DOCUMENTS

| | | | |
|---|---|---|---|
| 3,092,780 | 6/1963 | Fisher | 325/469 |
| 3,217,257 | 11/1965 | Boatwright | 325/349 |
| 3,611,169 | 10/1971 | Hess et al. | 325/475 |
| 4,035,730 | 7/1977 | Clayton | 325/347 |

*Primary Examiner*—Robert L. Griffin
*Assistant Examiner*—Marc E. Bookbinder
*Attorney, Agent, or Firm*—Martin LuKacher

[57] ABSTRACT

A tunable oscillating limiter threshold extension demodulator capable of demodulating video and other wide band width FM signals is described. A steering signal is generated to tune the oscillating limiter in response to the video output signals from an FM discriminator to which input signals from the oscillating limiter are applied. The steering signal is generated so as to be in proper phase relationship to track the frequency of the FM signal for modulating frequencies within certain critical regions and is reduced in amplitude over another region where proper phase relationship is not achievable because of unavoidable delays in the system. The steering signal generating circuit may be provided by a filter having a phase response characteristic such that the total phase lag of the system is small at the low frequency end of the band width and about 360° at the high frequency end of the band width. The filter presents substantial attenuation (in the form of a notch) in the frequency region of the band width where the phase delay may be about 180° and would otherwise provide improper oscillating limiter steering action. In the case of color television signals, for example, significant spectral components of the signal, specifically the components due to the sync and equalizing signals are present in the low frequency end of the signal band width while the significant color or chromatic subcarrier spectral component is at the high frequency end of the signal band width. Accordingly, when applied to tune the band pass filter of the oscillating limiter the frequency to which the oscillating limiter is tuned is caused to substantially match the instantaneous frequency of the color television modulated FM signal at the frequencies of these significant components and the noise threshold in terms of the minimum signal to noise ratio which the demodulator can operate properly is thereby improved.

11 Claims, 3 Drawing Figures

IF INPUT
INPUT AMPL.
12
14
LIMITER
10
ELECTRICALLY TUNABLE B.P.F.
16
DELAY ($t_D$)
36
EQUALIZER
34
DISCRIMINATOR
32
AMPL.
38
VIDEO OUT
40
44
42
46
LOW PASS FILTER (16 MHz)
BUFFER & GAIN CONTROL AMPL.
NOTCH SMOOTHING FILTER

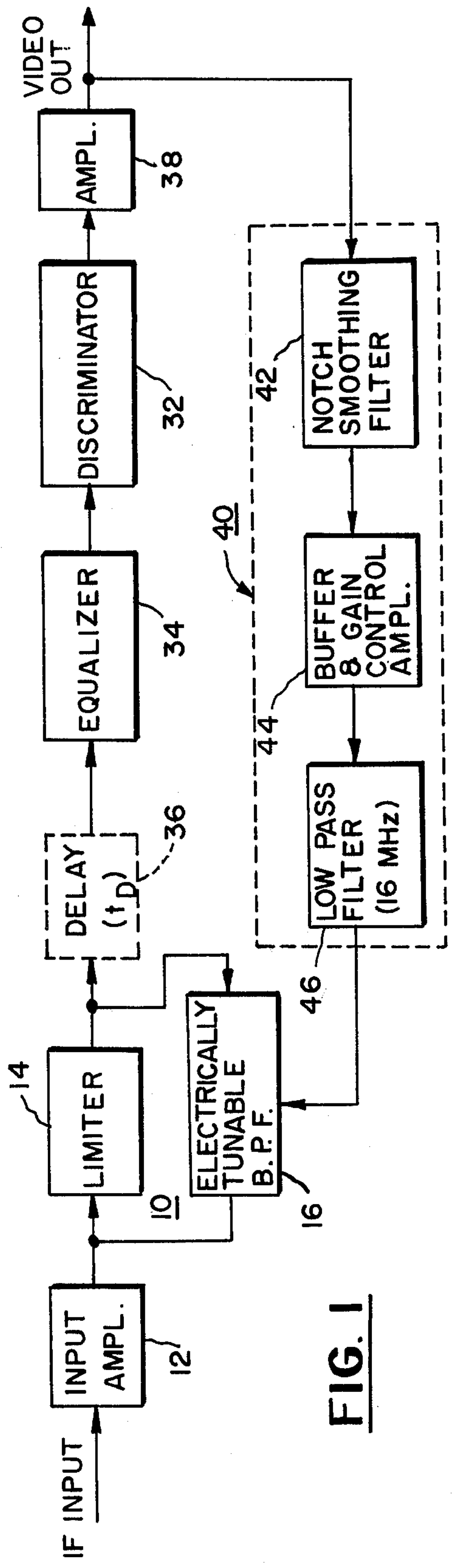
FIG. 1
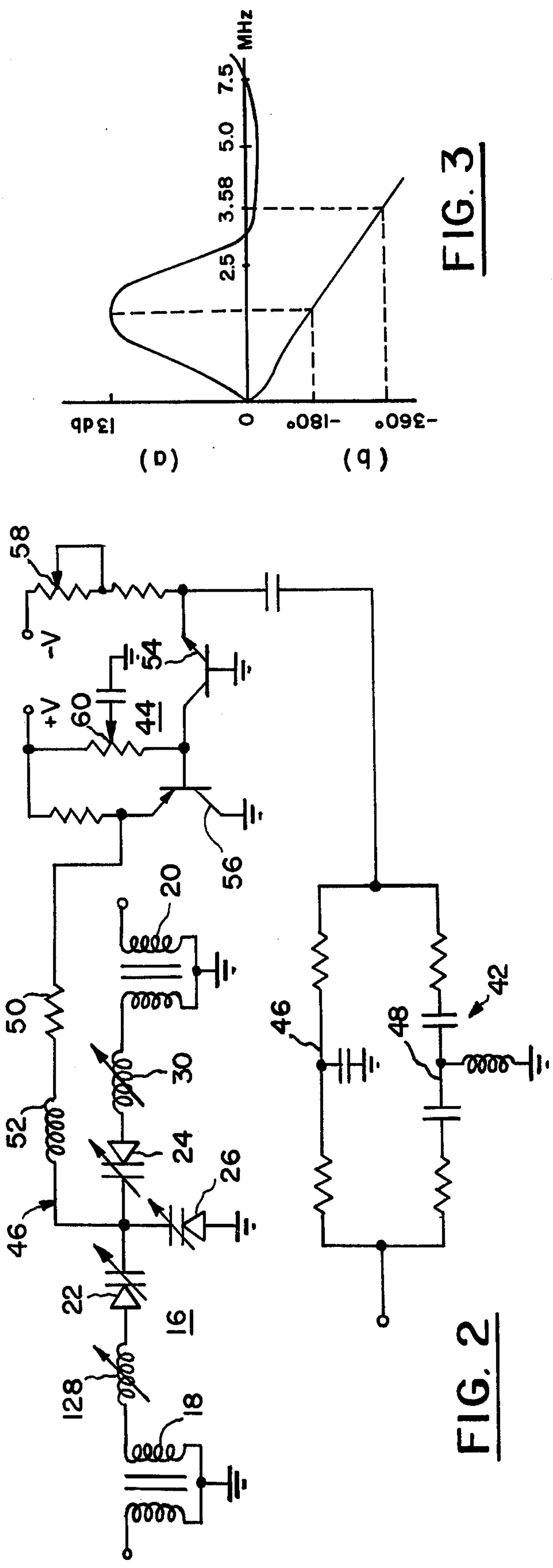
FIG. 2
FIG. 3

THRESHOLD EXTENSION FM DEMODULATOR APPARATUS FOR WIDE BAND WIDTH FM SIGNALS

The present invention relates to noise threshold extension FM demodulator apparatus for use with wide band FM signals such as FM signals modulated by color television signals, and particular to FM demodulators having oscillating limiter noise threshold extension circuitry.

The terms FM and frequency modulation as used herein should also be taken to mean phase or angle modulation as well as frequency modulation and the term FM demodulator or discriminator should also be taken to include phase and angle demodulators and discriminators as well as frequency demodulators and discriminators.

The invention is related to the invention in FM threshold extension demodulator apparatus described in U.S. patent application, Ser. No. 672,190, filed Mar. 31, 1976, in the name of Lorimer Clayton, Jr., now U.S. Pat. No. 4,035,730 and is an improvement thereon.

The invention is especially suitable for use in receivers for FM signals having video frequency modulation, particularly FM signals used to transmit color television signals such as are presently in use for color television broadcast relay transmission via satellite.

The oscillating limiter circuit consists of an amplitude limiter and a tuned circuit in feedback relationship therewith. The tuned circuit is tuned to the center freuency of the IF input signal to the limiter. In the presence of a strong input signal the oscillating limiter functions as a conventional amplitude limiter. For input signals near the threshold signal to noise ration, the oscillating limiter functions as a bandpass filter with a band width directly related to the amplitude of the input signal. When the tuning of the tuned circuit is made to track the frequency of the FM signal the threshold extension performance of the oscillating limiter is improved. Further improvement in FM threshold extension performance, especially when low modulation index FM signals are received, is obtained through the use of smoothing means which generates a steering signal for controlling the tuning of the tuned circuit such that the oscillating limiter is made less agile to noise and noise components are not tracked and permitted to enter the demodulator system. Reference may be had to the above identified related application for description of tunable oscillating limiters and various other means which have been suggested for improving FM threshold extension performance of FM demodulators. As noted in the related application, oscillating limiters are described in an article by E. J. Baghdady appearing in the IRE Transactions on Communications Systems, September 1961, at page 194. A tunable oscillating limiter which is made to track the frequency of an FM signal is described in a patent to Boatwright, U.S. Pat. No. 3,217,257.

Oftentimes FM signals which are transmitted have a wide bandwidth. Such wide bandwidth signals include video signals. Typical of such video signals are color television signals. The bandwidth of a color television signal may typically be 4.2 MHz when generated according to North American practice. The frequency deviation in a typical transmission may extend plus or minus 12 MHz and the base band signal produced by the FM discriminator which corresponds to the color television signal extends from DC to 4.2 MHz. There is an unavoidable delay associated with the tuned circuits in the FM discriminator. If a delay equalizer is used through which the FM signals are passed before demodulation to base band in the discriminator, delays associated with the equalizer must also be accounted for as part of this unavoidable delay. The phase shift (a phase lag) associated with this delay increases with frequency. Accordingly, the output signal from the discriminator is delayed in phase to significant extent over the wide band width. The use of this output signal to provide a steering signal for tuning the tuned circuit of an oscillating limiter makes the steering signal subject to the phase delay. Accordingly, the tuning of the oscillating limiter will not track the FM signal, and in the frequency region of the FM signal where the phase delay is about 80°, the tuning of the limiter would be in a direction directly away from rather than toward the instantaneous frequency of the FM signal. This invention provides means for processing the output signal from the discriminator in a manner to generate a steering signal which does track the FM input signal to the limiter for those modulating frequencies which are most important to signal quality and thus provides improved FM threshold extension performance with an oscillating limiter for FM signals having wide band width such as color television signals.

Accordingly, it is an object of the present invention to provide an improved FM demodulator having improved FM threshold extension performance in the demodulation of FM signals which are modulated with signals having a wide band width.

It is another object of the present invention to provide an improved FM demodulator having an oscillating limiter noise threshold extension circuit and which adapts such circuit for operation with wide band width FM modulated signals.

Briefly described, a threshold extension FM demodulator according to the invention has an oscillating limiter including a limiter circuit and a tunable band pass filter in feedback relationship therewith. A steering signal is generated in response to the output signal from an FM discriminator for varying the tuning of the bandpass filter so as to track the instantaneous frequency of the FM signal which is applied to the limiter. The steering signal is generated by circuit means such as a filter having an attenuation response characteristic across the band width of the FM modulating signals (the bandwidth of the base band signal provided at the output of the discriminator) which has a region of increased attenuation intermediate of the band width and a phase response characteristic which provide about 360° of total phase delay, including delays in the path of FM signals between the limiter and the output of the discriminator, at a frequency within the band width higher than the highest frequency occupied by the region of increased attenuation. In the case of a wide band width signal such as a color television signal, the region of the signal where the phase delay is 360° is desirably around the color or chromatic subcarrier frequency. The steering signal experiences little phase delay in the low frequency end of the color television band width where the significant synchronizing and equalizing signal component spectral energy is located. The increased attenuation, which may be in the form of a notch in the attenuation response characteristic, is in the region where the phase delay is significant and may be 180°. Accordingly, oscillating limiter action in this region is prevented from adversely affecting the FM threshold extension performance of the demodulator. The total FM threshold extension preformance is improved and the oscillating limiter is made operative for use with wide bandwidth FM modulated signals. The noise performance of the demodulator may be further improved by utilizing a low pass filter having a cut-off frequency above the upper end of the wide band signals to be demodulated. The amplitude of the steering signal is adjusted to establish the proper constant of proportionality such that the center frequency of the bandpass filter substantially matches the instantaneous frequency of the FM signal.

The foregoing and other objects and advantages of the present invention and a presently preferred embodiment thereof will become more readily apparent from a reading of the following description in connection with the accompanying drawings in which:

FIG. 1 is a block diagram of a threshold extension FM demodulator which emobodies the invention;

FIG. 2 is a schematic diagram showing the circuitry of the tunable bandpass filter and the circuits for generating and applying the steering signal thereto, which circuits are shown in block diagram form in FIG. 1; and FIG. 3 shows curves illustrating the attenuation and phase characteristics of the notch smoothing filter illustrated in FIG. 1, in combination with the system delay.

Referring more particularly to FIG. 1, the FM signal, as from the intermediate frequency (IF) amplifier stages of an FM receiver, is applied to an oscillating limiter 10 through an input amplifier 12. The oscillating limiter consists of an amplitude limiter circuit 14 and an electrically tunable bandpass filter 16 which is in regenerative feedback relationship therewith. The amplitude limiter 14 may be an active or passive limiter circuit such as a diode limiter or an integrated circuit IF limiter. Preferably the limiter circuit may be provided by a pair of fast logic gates connected in series which have thresholds or knees. Input signals of amplitude exceeding these threshold values are limited thereto. The tunable bandpass filter 16 may be connected across the limiter through diode or other gates which are controlled in accordance with the input signal amplitudes such that when the signal amplitude is above the level where threshold extension performance is required the tunable filter is disconnected from the limiter.

A suitable tunable bandpass filter 16 is shown in FIG. 2. This filter 16 includes input and output transformers 18 and 20. A T circuit consisting of series variable capacitor diodes 22 and 24 and a shunt variable capacitor diode 26 are connected to the input and output transformers 18 and 20 through variable inductors 28 and 30. Tuning is accomplished by a steering signal which is applied to the junction of the voltage variable capacitors. In the absence of an input signal, the oscillating limiter oscillates marginally at a frequency determined by the bandpass filter 16 (at the center frequency of that filter). In the presence of a strong signal the circuit functions as a conventional amplitude limiter. For input signals near the threshold signal to noise ratio the limiter 10 functions as a bandpass filter whose band width is an adaptive function of the amplitude of the input FM signal.

The oscillating limiter is connected to a FM discriminator 32 through an allpass delay equalizer 34 which equalizes the delay across the entire FM signal bandwidth. This bandwidth may be plus or minus 16 MHz in the case of color television FM signals. The equalizer nd discriminator contain tuned circuits. Associated with the circuits and due to their inherent or distributed capacitance and inductance at the IF frequencies, is an unavoidable delay. This delay is shown schematically by the dash line block 36. Although the time delay ($t_D$) interposed by the unavoidable delay 36 may be essentially constant over the band width of the FM modulated color television signal, the phase lag varies wth frequency over the bandwidth. The signal at the output of the discriminator thus can be expected to be out of phase with the FM signal in the limiter. The output signal then does not track the instantaneous frequency of the FM signal in the limiter. If applied to steer the electrically tunable bandpass filter 16 the steering signal would, especially in the region where the phase delay is around 180°, steer the filter in the wrong direction. In such event, the FM threshold performance wll be degraded rather than improved.

It is the output signal from the discrimator which after amplification in a buffer amplifier 38 provides the video output signal from the demodulator. This video output signal will be the base band signal carrying the color television information across the 4.2 MHz frequency spectrum thereof. This baseband signal is utilized by circuit means 40 to generate a steering signal which provides threshold extension performance in spite of the unavoidable delays. These circuit means 40 are contained in the loop around the oscillating limiter 10. This loop defines a path for the steering signal and consists of the circuit means 40, the unavoidable delay 36, the equalizer 34, the FM discriminator 32 and the amplifier 38. The circuit means 40 is provided by a notch smoothing filter 42, a buffer and gain control amplifier stage 44 and a low pass filter 46. The notch smoothing filter has the attenuation characteristic shown in the upper curve (a) of FIG. 3 and, in combination with the system delay, the phase response characteristic shown in the lower curve (b) of FIG. 3. The notch smoothing filter provides a notch or region of increased attenuation, shown in curve (a) of FIG. 3, as being approximately 13 dB, in a region where the phase delay, the total delay around the loop through which the steering signal passes, is unfavorable for tracking of the instantaneous frequency of the Fm signal by the tunable bandpass filter 16. Particularly it will be noted that the region of increased attenuation or notch in the attenuation response occurs where the total phase delay is around 180°. Accordingly, the steering signal is attenuated sufficiently so as not to allow the oscillating limiter 10 to operate in a manner to derogate the FM threshold extension performance. Attenuation is minimal in the low frequency region where significant spectral components due to sync and equalizing signals are located and in the high frequency region where the color subcarrier is located.

The phase response of the notch smoothing filter 42 is such that the total phase delay in the regions where sync and equalizing signals are located is minimal. At the color subcarrier frequency (3.58 MHz) the total phase delay which of course includes the unavoidable delays in the loop, is approximately 360°, which is equivalent to a substantially in phase condition. Accordingly, tracking of the instantaneous frequency is accomplished in the low frequency and high frequency regions of the wide band width of the color television signal and the overall threshold extension performance is improved.

The notch smoothing filter 42 may be implemented by a circuit, which as shown in FIG. 2, has a low pass section 46 and high pass section 48. These sections 46 and 48 are in bridging relationship with each other. It will be noted that the response of the smoothing filter 42 extends beyond the upper end of the bandwidth (viz, beyond 4.2 MHz). Accordingly, it may be desirable to eliminate noise components in this region. This may be accomplished by the low pass filter 46 which may have a cut-off frequency from 10 to 16 MHz. This low pass filter is implemented by a series resistor 50 and inductor 52 and utilizes the effective shunt capacitance provided by the capacitor diode 26 and the other capacitor diodes 22 and 24. The steering signal will, by virtue of the low pass filter 46, not follow the noise component in the discriminator output signal (viz, in the video output).

The buffer and gain control amplifiers 44 are provided by a grounded base buffer amplifier 54 and an emitter follower amplifier 56. Gain, and center frequency adjustment if provided by the potentiometers 558 and 60. Gain adjustments are made to establish the proper constant of proportionality between the steering signal amplitude and the center freuency of the bandpass filter 16. Accordingly, the circuit means 40 which generate and apply the steering signal enable the demodulator to have FM threshold extension performance over the entire wide band width of the color television signal.

From the foregoing description it will be apparent that there has been provided improved FM threshold extension demodulator apparatus especially suitable for wide band signals. Variations and modifications wthin the scope of the invention will undoubtedly suggest themselves to those skilled in the art. Accordingly, the foregoing description should be taken as illustrative and not in any limiting sense.

What is claimed is:

1. For use in apparatus for demodulating FM signals which carry wide band-width modulation, such as color televison signals, said apparatus having a discriminator circuit for providing output signals corresponding to the frequency of said FM signals, noise threshold extension circuitry which comprises (a) an amplitude limiter, said limiter being connected to provide said FM signals to said discriminator, (b) a tunable bandpass filter connected in regenerative feedback relationship across said limiter, and (c) circuit means responsive to said discriminator circuit output signals for generating and applying to said tunable bandpass filter a steering signal for varying the tuning of said bandpass filter, said circuit means having an attenuation response characteristic across said bandwidth with a region of increased attenuation intermediate of said bandwidth and a phase response characteristic which provides about 360° total phase delay, including delays in the path of said FM signals between said limiter and said generating and applying means, at a frequency within said bandwidth higher than the highest frequency occupied by said region.

2. The invention as set forth in claim 1 wherein said circuit means for generating and applying said steering signal includes means for attenuating any higher frequency components of said output signals which exist above said bandwidth whereby to remove noise from said steering signal.

3. The invention as set forth in claim 1 wherein said circuit means for generating and applying said steering signal includes means for adjusting the amplitude of said steering signal so that the center frequency of said bandpass filter and the amplitude of said steering signal are proportional to each other whereby said center frequency is matched to the frequecy of said FM signals.

4. The invention as set forth in claim 3 wherein said circuit means for generating and applying said steering signal further includes means for attenuating any higher frequency componenets of said output signals which exist above said bandwidth whereby to remove noise from said steering signal.

5. the invention as set forth in claim 3 wherein said circuit means for generating and applying said steering signal is a first filter having a response characteristic with a notch defining said region which is coupled in the path of said steering signal to said tunable bandpass filter, and wherein said attenuating means is a second filter having a low pass characteristic which is also coupled in said path.

6. the invention as set forth in claim 1 wherein said circuit means for generating and applying said steering signal comprises a filter hving a notch in said region.

7. The invention as set forth in claim 6 whrein said FM signals are color television signals which extend across said bandwidth and said frequency at which said total phase delay is about 360° is the color subcarrier frequency and said notch is above the band to which spectral energy is supplied principally by sync and equalizing pulses of said color television signals and is located where said total phase delay is about 180°.

8. The invention as set forth in claim 6 wherein said notch filter comprises a high pass section and a low pass section in bridged relationship with each other.

9. The invention as set forth in claim 6 wherein said circuit means for generating and applying said steering signal further comprises means providing a low pass filter having a cutoff frequency at a frequency in the range from about 10 to 16 MHz coupled to said notch filter in the path of said steering signal to said tunable bandpass filter.

10. The invention as set forth in claim 9 wherein said circuit means for generating and applying said steering signal further comprises an amplifier circuit also coupled in said path of said steering signal for adjusting the amplitude of said steering signal and the center frequency to which said tunable band pass filter is tuned.

11. The invention as set forth in claim 1 wherein said circuit means for generating and applying said steering signal comprises filter means having a low pass characteristic with a cut off frequency above said band width and a notch in said region.

* * * * *